United States Patent

Kosic

[11] Patent Number: 5,806,544
[45] Date of Patent: Sep. 15, 1998

[54] CARBON DIOXIDE JET SPRAY DISK CLEANING SYSTEM

[75] Inventor: Thomas J. Kosic, Redondo Beach, Calif.

[73] Assignee: Eco-Snow Systems, Inc., Livermore, Calif.

[21] Appl. No.: 799,679

[22] Filed: Feb. 11, 1997

[51] Int. Cl.⁶ ................................................. B08B 3/02
[52] U.S. Cl. ................... 134/68; 134/66; 134/131; 134/133; 134/144; 134/902; 414/222
[58] Field of Search .................. 134/129, 131, 134/902, 172, 180, 185, 144, 133, 68, 66; 414/222; 198/346.2

[56] References Cited

U.S. PATENT DOCUMENTS

| | | | |
|---|---|---|---|
| 4,132,235 | 1/1979 | Koplin | 134/133 |
| 4,208,760 | 6/1980 | Dexter et al. | 134/133 |
| 4,408,560 | 10/1983 | Caratsch | 134/68 |
| 4,558,984 | 12/1985 | Garrett | 414/222 |
| 4,561,144 | 12/1985 | Marais | 134/133 |
| 4,694,527 | 9/1987 | Yoshizawa | 134/902 |
| 4,902,350 | 2/1990 | Steck | 134/902 |
| 5,269,643 | 12/1993 | Kodama et al. | 414/222 |
| 5,372,652 | 12/1994 | Srikrishnan et al. | 134/902 |
| 5,543,022 | 8/1996 | Nguyen et al. | 414/222 |
| 5,660,585 | 8/1997 | Swoboda et al. | 134/902 |
| 5,730,162 | 3/1998 | Shindo et al. | 134/66 |

FOREIGN PATENT DOCUMENTS

| | | | |
|---|---|---|---|
| 60-245136 | 12/1985 | Japan | 134/902 |
| 4-233729 | 8/1992 | Japan | 134/902 |
| 4-294535 | 10/1992 | Japan | 134/902 |
| 5-36662 | 2/1993 | Japan | 134/902 |
| 6-120190 | 4/1994 | Japan | 134/902 |

*Primary Examiner*—Frankie L. Stinson
*Attorney, Agent, or Firm*—R. Craig Armstrong

[57] ABSTRACT

Apparatus for cleaning disks during processing. The apparatus is used with a disk processing system having a conveyor belt for transporting a disk carrier containing disks. The conveyor belt and the disk carrier have openings therein. A cleaning station is disposed above the conveyor belt and has an opening therein that isolates the cleaning station from the processing system. The cleaning station has a recirculating blower system, a laminar flow screen, a HEPA filter, and a ducting system for recirculating purified air or inert gas. A carbon dioxide jet spray cleaning system is provided that has a plurality of sets of jet spray nozzles disposed in the cleaning station that are coupled by way of manifolds to a liquid carbon dioxide tank that supplies liquid carbon dioxide to the nozzles. A lifting mechanism is disposed beneath the conveyor belt that has a lower support member that is caused to extend upward through the openings to lift one disk at a time upward into the cleaning station in front of the sets of jet spray nozzles for cleaning An upper support member is disposed above the lifted disk that holds it during cleaning. In a first embodiment, the disk is held in a fixed position while the nozzles are scanned across it, while in a second embodiment, the nozzles are fixed and the disk is moved past the nozzles.

4 Claims, 2 Drawing Sheets

CARBON DIOXIDE JET SPRAY DISK CLEANING SYSTEM

BACKGROUND

The present invention relates generally to cleaning systems, and more particularly, to apparatus that uses a liquid carbon dioxide jet spray cleaning system to clean disk media during processing.

During manufacture, disk substrates are loaded into a disk carrier containing grooves that each hold a single disk. The disk carrier is then placed on a conveyor where it is transported to a variety of processing stations. At each processing station, a particular operation is performed on each of the disks.

In the past, the disk carriers are initially cleaned and relatively clean disks are loaded into them for processing. However, it has been found that contaminating particles and debris finds its way onto the surfaces of the disks during the processing operations. Potentially, the contaminating particles and debris can adversely affects the performance of the fabricated disks.

Heretofore, no manufacturer has attempted to clean the disks during processing. Typically, the cleaning processes are too slow and time consuming to be cost-effective. Furthermore, no conventional cleaning procedure provides acceptable cleaning performance that may be used during processing of the disks.

Consequently, it would be advantageous to have an apparatus for cleaning disk media, such as optical and magnetic disks, during processing. Accordingly, it is an objective of the present invention to provide for such an apparatus.

SUMMARY OF THE INVENTION

To meet the above and other objectives, the present invention provides for apparatus that may be used to clean disk substrates during processing. The apparatus comprises a carbon dioxide jet spray cleaning system disposed within an environmental cleaning station of a disk processing system.

The disk processing system is a conveyerized system wherein a conveyor belt transports a disk carrier containing disks held in grooves. The cleaning station is provided by the present invention that includes a recirculating blower system, a laminar flow screen, a high efficiency particulate air (HEPA) filter, and a ducting system for recirculating purified air or inert gas. The cleaning station is disposed above the conveyor belt and contains a plurality of sets of jet spray nozzles that generally face each other. The plurality of sets of jet spray nozzles are coupled by way of manifolds to a liquid carbon dioxide tank that supplies liquid carbon dioxide to the jet spray nozzles.

Two embodiments of the present invention are provided. In a first embodiment, the plurality of sets of jet spray nozzles are moveable and the disk is fixed during cleaning. In a second embodiment, the plurality of sets of jet spray nozzles are fixed and the disk moves while it is cleaned.

In the first embodiment of the present invention, a lifting mechanism is disposed beneath the conveyor belt and has a lower support member that is caused to extend upward through an opening in the disk carrier and lift one disk at a time upward into the cleaning station and in front of the sets of jet spray nozzles. An upper support member is disposed above the lifted disk and holds it during cleaning. This arrangement provides for a stable three-point holding fixture.

During operation, the conveyor belt sequentially moves the disk carrier into a position where each disk is lifted into cleaning position by the lifting mechanism. Liquid carbon dioxide is supplied to the sets of jet spray nozzles. The sets of jet spray nozzles are scanned across the surfaces of the disk. Jet sprays produced by the sets of jet spray nozzles impinge upon both surfaces of the disk. The action of the jet sprays cleans contaminating particles from the surfaces of the disk. The removed particles are swept away by the flow of air or inert gas and are filtered by the HEPA filter.

In a second embodiment of the present invention, the sets of jet spray nozzles are fixed. The upper support member is lowered to secure a disk to hold it during cleaning. The lifting mechanism and the upper support member then move upwardly in synchronism to lift the secured disk past the fixed nozzles. Jet sprays produced by the fixed sets of jet spray nozzles impinge upon both surfaces of the disk as the disk moves past them. The action of the jet sprays cleans contaminating particles from the surfaces of the disk. The contaminating particles are swept away by the flow of air or inert gas and are filtered by the HEPA filter.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
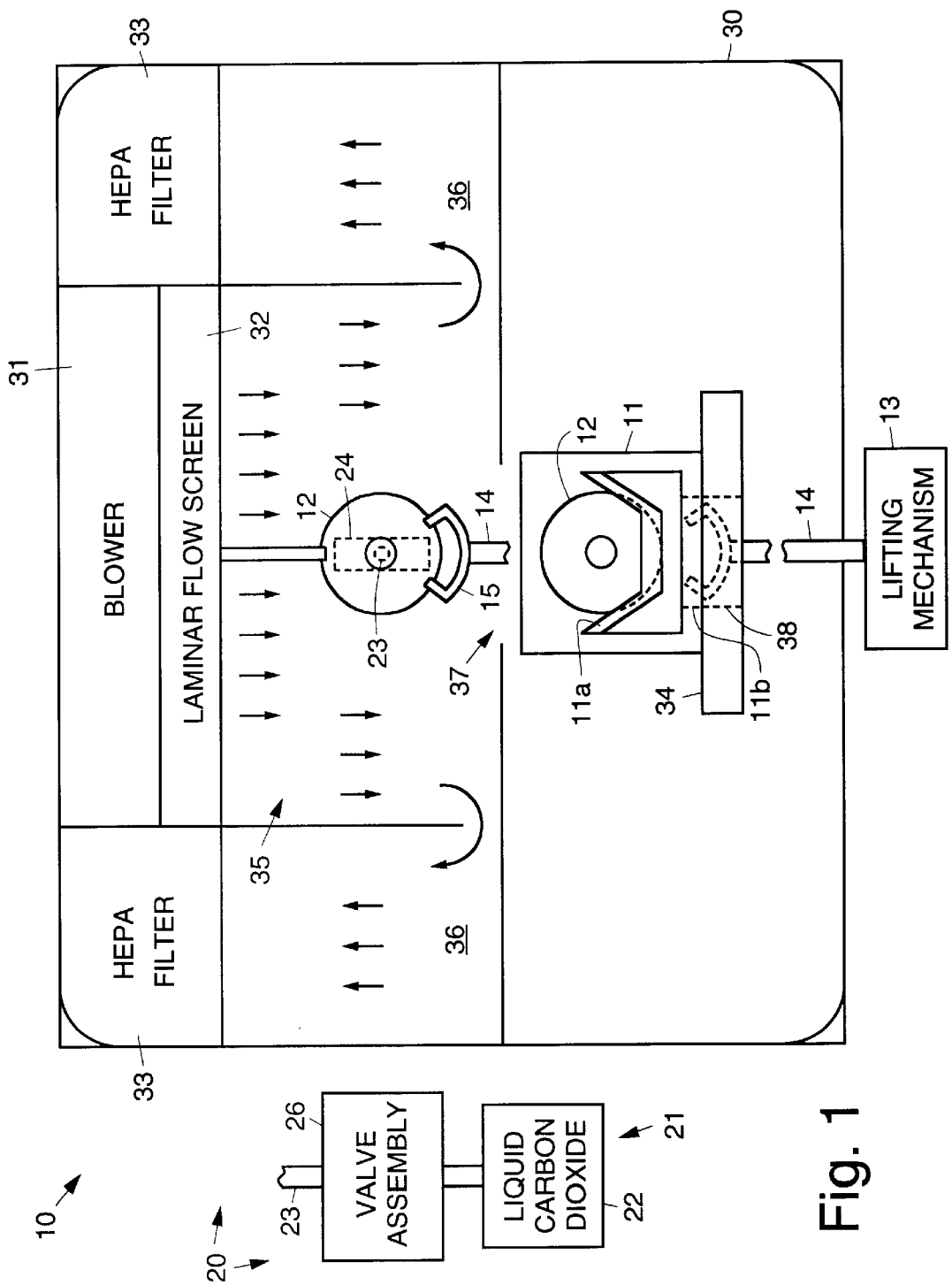
FIG. 1 illustrates an end view of apparatus in accordance with the principles of the present invention for cleaning disks during processing.
Figure 2:
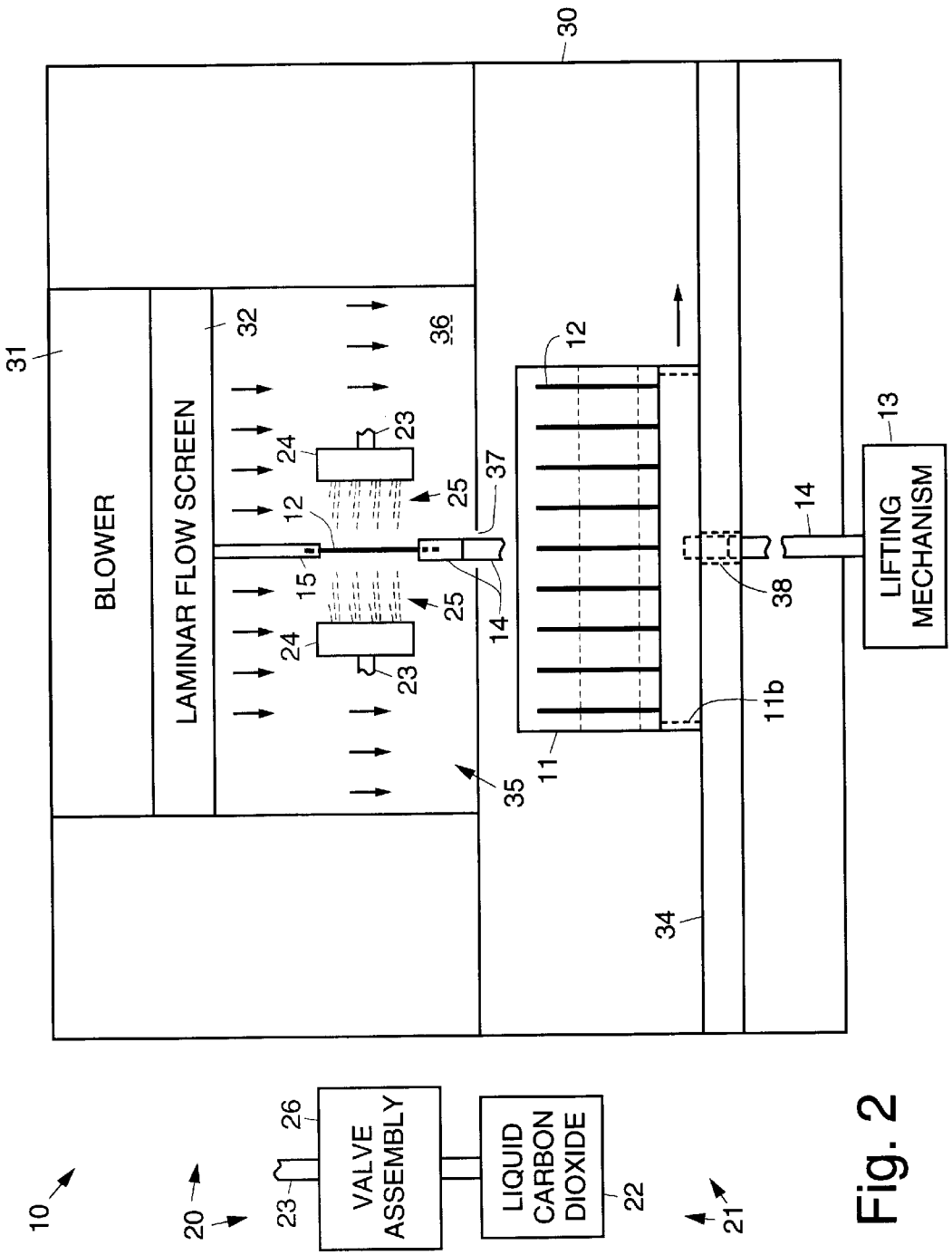
FIG. 2 illustrates a side view of the apparatus of FIG. 1.

Referring to the drawing figures, FIG. 1 is an end view illustrating apparatus 10 in accordance with the principles of the present invention for cleaning disks 12, such as magnetic or optical disks 12, for example, during processing. FIG. 2 illustrates a side view of the apparatus 10 of FIG. 1. FIGS. 1 and 2 illustrate two operative embodiments of the present invention. The apparatus 10 comprises a carbon dioxide jet spray cleaning system 20 having sets of jet spray nozzles 24 disposed within an environmental cleaning station 35 of a disk processing system 30.

The disk processing system 30 comprises a conveyor belt 34 that transports a disk carrier 11 containing disks 12 held in grooves 11a. The cleaning station 35 is disposed above the conveyor belt 34 and is isolated from the disk processing system 30. Disks enter the cleaning station 35 from the disk processing system 30 by way of an opening 37 disposed therebetween. This arrangement minimizes the flow of contaminating particles between the cleaning station 35 and the disk processing system 30.

The cleaning station 35 provided by the present invention includes a recirculating blower system 31, a laminar flow screen 32, a high efficiency particulate air (HEPA) filter 33, and a ducting system 36 for recirculating purified air or inert gas. The use of the filter 33 and the laminar flow screen 32 produces purified uncontaminated air or inert gas containing no more than about 1–2 particles per cubic foot.

In a first embodiment of the present invention, the cleaning station 35 contains a plurality of sets of moveable jet spray nozzles 24 that generally face each other. The plurality of sets of moveable jet spray nozzles 24 are coupled by way of manifolds 23 to a liquid carbon dioxide tank 22 that supplies liquid carbon dioxide to the jet spray nozzles 24 by way of a valve assembly 26. The tank 22, valve assembly 26, manifolds 23, and sets of jet spray nozzles 24 form a carbon dioxide jet spray delivery system 21.

A lifting mechanism 13 is disposed beneath the conveyor belt 34 and has a lower support member 14 that is caused to extend upward through an opening 38 in the conveyor belt 34 and an opening 11b in the disk carrier 11. This action lifts one disk 12 at a time upward into the cleaning station 35 and in front of the sets of jet spray nozzles 24. An upper support member 15 is disposed above the lifted disk 12 and holds it during cleaning. The use of the upper and lower support members 15, 14 provides for a stable three-point holding fixture that holds the disk 12 during cleaning.

During operation of the first embodiment, the conveyor belt 34 sequentially moves the disk carrier 11 into a position so that each disk 12 is aligned with the opening 37 between the cleaning station 35 and the disk processing system 30. Each disk 12 is lifted into cleaning position by the lifting mechanism 13. Liquid carbon dioxide is supplied to the sets of jet spray nozzles 24. The sets of jet spray nozzles 24 are scanned across, or moved relative to, the surfaces of the disk 12. Jet sprays 25 produced by the sets of jet spray nozzles 24 impinge upon surfaces of the disk 12. The action of the jet sprays 25 cleans contaminating particles from the surfaces of the disk 12. The removed particles are swept away by the flow of air or inert gas generated by the blower system 31 and are filtered by the HEPA filter 33.

The cleaning station 35 forms a controlled environmental enclosure that is similar to a process enclosure disclosed in U.S. Pat. No. 5,316,560 entitled "Environment Control Apparatus", which is assigned to the assignee of the present invention, the contents of which are incorporated herein by reference. The cleaning station 35 is constructed and operates in a manner similar to the controlled environmental enclosure disclosed in this patent.

The sets of jet spray nozzles 24 produce jet sprays 25 of gaseous and solid carbon dioxide material (snow) that is used to clean the disks 12. The carbon dioxide snow or spray 25 comprises solid carbon dioxide particles and gas and is sprayed from the jet spray nozzles 24 onto the disks 12 to clean them. Momentum transfer between the solid carbon dioxide particles and contaminant particles on sprayed surfaces of the disks 12 removes the contaminant particles from the surfaces.

Excess gas from the jet sprays 25 and contaminant particles dislodged from the surface of the disks 12 are collected by the HEPA filter 33 and are removed by the laminar air flow screen 32. The high capacity blower system 31 thus supplies a clean air or gas flow to the cleaning station 35.

In a second embodiment of the present invention, the sets of jet spray nozzles 24 are fixed. Preferably, the fixed sets of jet spray nozzles 24 are disposed in a horizontal orientation, although this is not absolutely required. The upper support member 15 is lowered to secure a disk 12 to hold it during cleaning. The lifting mechanism 13 including the lower and upper support members 14, 15 then move upwardly in synchronism to lift the secured disk 12 past the fixed sets of jet spray nozzles 24. Jet sprays produced by the fixed sets of jet spray nozzles 24 impinge upon both surfaces of the disk as the disk moves past them. The action of the jet sprays 25 cleans contaminating particles from the surfaces of the disk 12. The removed particles are swept away by the flow of air or inert gas generated by the blower system 31 and are filtered by the HEPA filter 33.

Thus, apparatus that uses a liquid carbon dioxide jet spray cleaning system to clean disks during processing has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus for cleaning disks during processing, comprising:

a disk processing system comprising a conveyor belt for transporting a disk carrier containing disks, wherein the conveyor belt has an opening therein, and wherein the disk carrier has an opening therein;

an environmental cleaning station disposed above the conveyor belt having an opening disposed between the cleaning station and the disk processing system, and wherein the cleaning station comprises a recirculating blower system, a laminar flow screen, a high efficiency particulate air filter, and a ducting system for recirculating purified air or inert gas;

a carbon dioxide jet spray cleaning system comprising a plurality of sets of jet spray nozzles disposed within the environmental cleaning station that are coupled by way of manifolds to a liquid carbon dioxide tank that supplies liquid carbon dioxide to the jet spray nozzles; and a lifting mechanism disposed beneath the conveyor belt having a lower support member that is extendible upward through the openings in the conveyor belt and disk carrier, and having an upper support member disposed above the lifted disk that holds it during cleaning, and wherein the lifting mechanism lifts a disk upward into the cleaning station and in front of the sets of jet spray nozzles.

2. The apparatus of claim 1 wherein the plurality of sets of jet spray nozzles are fixed and the lifting mechanism and upper support member cooperate to lift the disk past the fixed sets of jet spray nozzles during cleaning.

3. The apparatus of claim 1 wherein the plurality of sets of jet spray nozzles are moveable and the lifting mechanism and upper support member cooperate to lift the disk into a fixed position within the environmental cleaning station and wherein the sets of jet spray nozzles are moved relative to the surfaces of the disk to clean it.

4. The apparatus of claim 1 wherein the carbon dioxide jet spray cleaning system further comprises a valve assembly.

* * * * *